United States Patent
Nersessian et al.

(10) Patent No.: US 7,397,169 B2
(45) Date of Patent: Jul. 8, 2008

(54) ENERGY HARVESTING USING A THERMOELECTRIC MATERIAL

(75) Inventors: Nersesse Nersessian, Van Nuys, CA (US); Gregory P. Carman, Los Angeles, CA (US); Harry B. Radousky, San Leandro, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 672 days.

(21) Appl. No.: 11/082,632

(22) Filed: Mar. 16, 2005

(65) Prior Publication Data

US 2005/0205125 A1    Sep. 22, 2005

Related U.S. Application Data

(60) Provisional application No. 60/554,747, filed on Mar. 19, 2004.

(51) Int. Cl.
*H01L 41/08* (2006.01)
(52) U.S. Cl. .................................................. 310/339
(58) Field of Classification Search ................ 310/339
See application file for complete search history.

(56) References Cited

U.S. PATENT DOCUMENTS

| | | | |
|---|---|---|---|
| 4,733,121 A * | 3/1988 | Hebert | 310/311 |
| 5,188,286 A | 2/1993 | Pence | |
| 5,550,387 A | 8/1996 | Elsner | |
| 6,019,098 A | 2/2000 | Bass | |
| 6,053,163 A | 4/2000 | Bass | |
| 6,459,658 B1 * | 10/2002 | Fujita et al. | 368/203 |
| 6,496,351 B2 | 12/2002 | Hill et al. | |
| 6,527,548 B1 | 3/2003 | Kushch et al. | |
| 6,710,238 B1 | 3/2004 | Shingu et al. | |
| 6,750,596 B2 * | 6/2004 | Kim et al. | 310/339 |
| 7,034,440 B2 * | 4/2006 | Kim et al. | 310/339 |
| 7,148,579 B2 * | 12/2006 | Pinkerton et al. | 290/1 R |
| 2004/0238022 A1 | 12/2004 | Hiller et al. | |
| 2006/0066434 A1 * | 3/2006 | Richards et al. | 337/14 |

* cited by examiner

*Primary Examiner*—Thomas M Dougherty
(74) *Attorney, Agent, or Firm*—Michael C. Staggs; John H. Lee

(57) ABSTRACT

A novel energy harvesting system and method utilizing a thermoelectric having a material exhibiting a large thermally induced strain (TIS) due to a phase transformation and a material exhibiting a stress induced electric field is introduced. A material that exhibits such a phase transformation exhibits a large increase in the coefficient of thermal expansion over an incremental temperature range (typically several degrees Kelvin). When such a material is arranged in a geometric configuration, such as, for a example, a laminate with a material that exhibits a stress induced electric field (e.g. a piezoelectric material) the thermally induced strain is converted to an electric field.

28 Claims, 4 Drawing Sheets

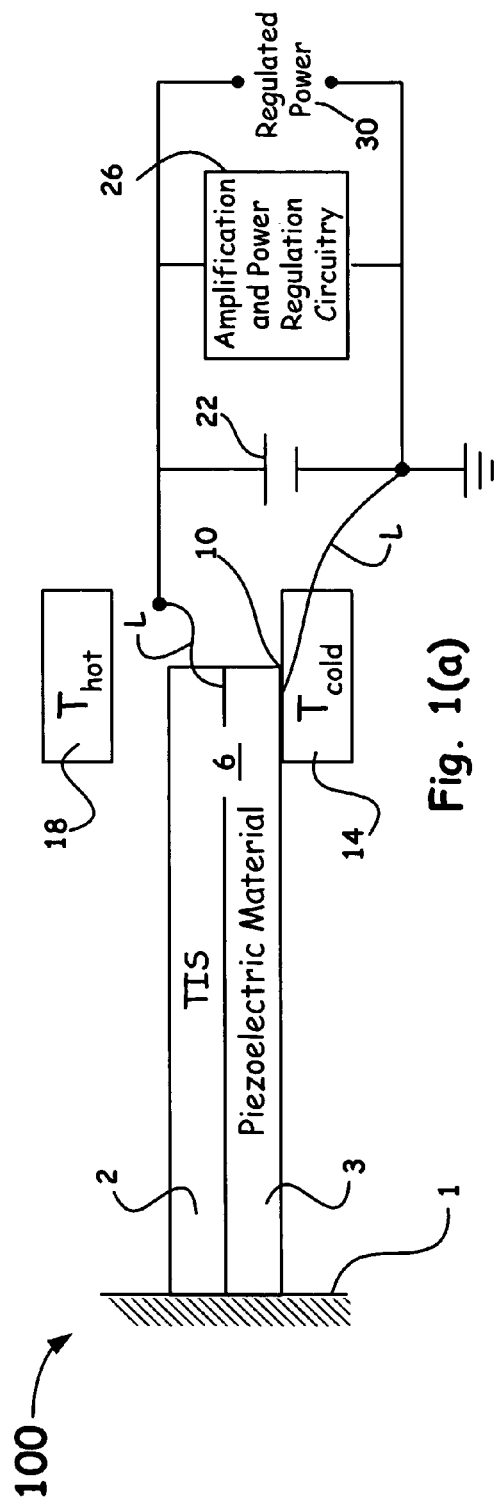
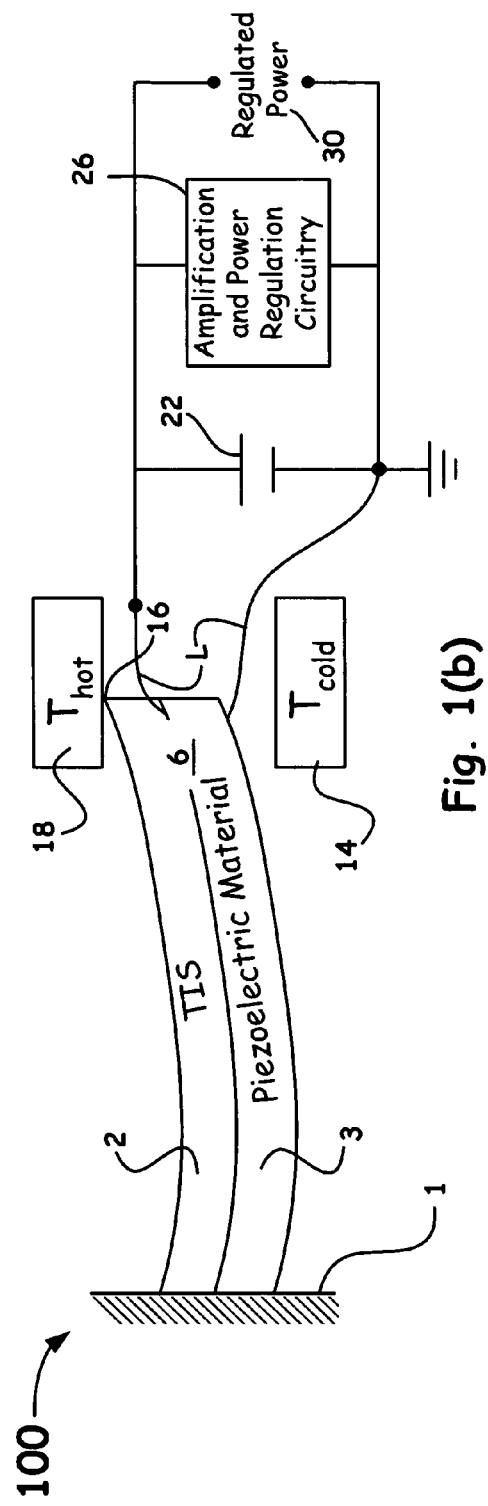
Fig. 1(a)
Fig. 1(b)

ENERGY HARVESTING USING A THERMOELECTRIC MATERIAL

CROSS-REFERENCE TO RELATED APPLICATIONS

This application claims the benefit of U.S. Provisional Application No. 60/554,747, filed Mar. 19, 2004, entitled "Energy Harvesting System Using A Thermoelectric Material," which is incorporated herein by this reference.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates in general to an energy harvesting system/method and, more particularly, to a method/system that includes a thermostrictive material and a piezoelectric element, such as, a laminate capable of harvesting waste heat.

2. Description of Related Art

Waste heat is always generated whenever work is done. Harvesting such waste heat can increase the efficiency of engines, be used to power numerous devices (eliminating the need for auxiliary power sources), and in general, significantly reduce power requirements. Various methods have been used to try and harvest such waste heat, the most important of which is through thermoelectric materials.

In order to efficiently convert waste heat to usable electrical energy, thermoelectric materials generally requires a large Seebeck coefficient having a "figure of merit" or Z, defined as $Z=S^2/\rho K$, where S is the Seebeck coefficient, $\rho$ is the electrical resistivity, and K is the thermal conductivity. The Seebeck coefficient is further defined as the ratio of the open-circuit voltage to the temperature difference between the hot and cold junctions of a circuit exhibiting the Seebeck effect, or $S=V/(T_h^{31\ T}{}_c)$. Therefore, in searching for a good thermoelectric material, materials with large values of S, and low values of $\rho$ and K are beneficial.

However, current state of the art thermoelectric materials utilized to harvest waste heat and convert such heat to a useful energy, for example, devices that use a combination of n-type and p-type materials, generally have Seebeck coefficients on the order of several $100\,\mu V°K^{-1}$, which is too low for practical applications.

Background information for thermoelectric devices is described and claimed in U.S. Pat. No. 5,550,387, entitled "Superlattice Quantum Well Material," issued Aug. 27, 1996 to Elsner et al., including the following, "The present invention provides thermoelectric elements having a very large number of alternating layers of semiconductor material, the alternating layers all having the same crystalline structure. This makes the vapor deposition process easy because the exact ratio of the materials in the layers is not critical. The inventors have demonstrated that materials produced in accordance with this invention provide figures of merit more than six times that of prior art thermoelectric materials. A preferred embodiment is a superlattice of Si, as a barrier material, and SiGe, as a conducting material, both of which have the same cubic structure. Another preferred embodiment is a superlattice of B—C alloys, the layers of which would be different stoichiometric forms of B—C but in all cases the crystalline structure would be alpha rhombohedral. In a preferred embodiment the layers are grown under conditions as to cause them to be strained at their operating temperature range in order to improve the thermoelectric properties."

Background information on an energy harvesting system is described and claimed in U.S. Pat. No. 2004/0238022 A1, entitled "Thermoelectric Power From Environmental Temperature Cycles," issued Dec. 2, 2004 to Hiller et al., including the following, "The present invention provides an electric generator system for producing electric power from the environmental temperature changes such as occur during a normal summer day on Earth or Mars. In a preferred embodiment a phase-change mass is provided which partially or completely freezes during the relatively cold part of a cycle and partially or completely melts during the relatively hot part of the cycle. A thermoelectric module is positioned between the phase-change mass and the environment. The temperature of the phase-change mass remains relatively constant throughout the cycle. During the hot part of the cycle heat flows from the environment through the thermoelectric module into the phase change mass generating electric power which is stored in an electric power storage device such as a capacitor or battery. During the cold part of the cycle heat flows from the phase change mass back through the module and out to the environment also generating electric power that also is similarly stored. An electric circuit is provided with appropriate diodes to switch the direction of the current between the hot and cold parts of the cycle. A preferred phase change mass is a solution of water and ammonia that has freeze points between about 270 K to about 145 K depending on the water ammonia ratio. Preferably, a finned unit is provided to efficiently transfer heat from a module surface to the environment."

A need exists for an improved thermoelectric method and system configured as, for example, a laminate so as to harvest waste heat as energy. The present invention is directed to such a need.

SUMMARY OF THE INVENTION

The present invention is directed to an energy harvesting system that includes a thermoelectric material exhibiting a large thermally induced strain (TIS) due to a phase transformation and a material exhibiting a stress induced electric field.

Another aspect of the present invention is directed to an energy harvesting method, that includes: providing a cooling source capable of producing a predetermined temperature gradient; providing a heating source capable of producing a predetermined temperature gradient; providing a thermoelectric material, wherein the thermoelectric material further comprises: one or more thermostrictive materials capable of producing a predetermined induced strain when subjected to a cycled contact with the cooling source and the heating source over a predetermined temperature range; one or more piezoelectric materials capable of producing an induced voltage resulting from the predetermined induced strain produced by the one or more thermostrictive materials; and wherein a predetermined power output is capable of being produced at a frequency determined by the cycled predetermined temperature range.

Accordingly, the present invention provides a desired system and method for converting waste heat into useful energy (i.e., harvesting energy). Such a system and method can beneficially harvest energy from, for example, hot engines, heat generated from computers, hot asphalt, from body heat, from the daily cycle of day and night, and even from the thermocline in the ocean. Such a device is expected to significantly reduce power requirements by for example, reducing the need for cooling systems and by using the harvested energy to power peripheral devices.

BRIEF DESCRIPTION OF THE DRAWINGS

FIGS. 1(a)-(b) illustrate an energy harvesting apparatus.

DETAILED DESCRIPTION OF THE INVENTION

Figure 2:
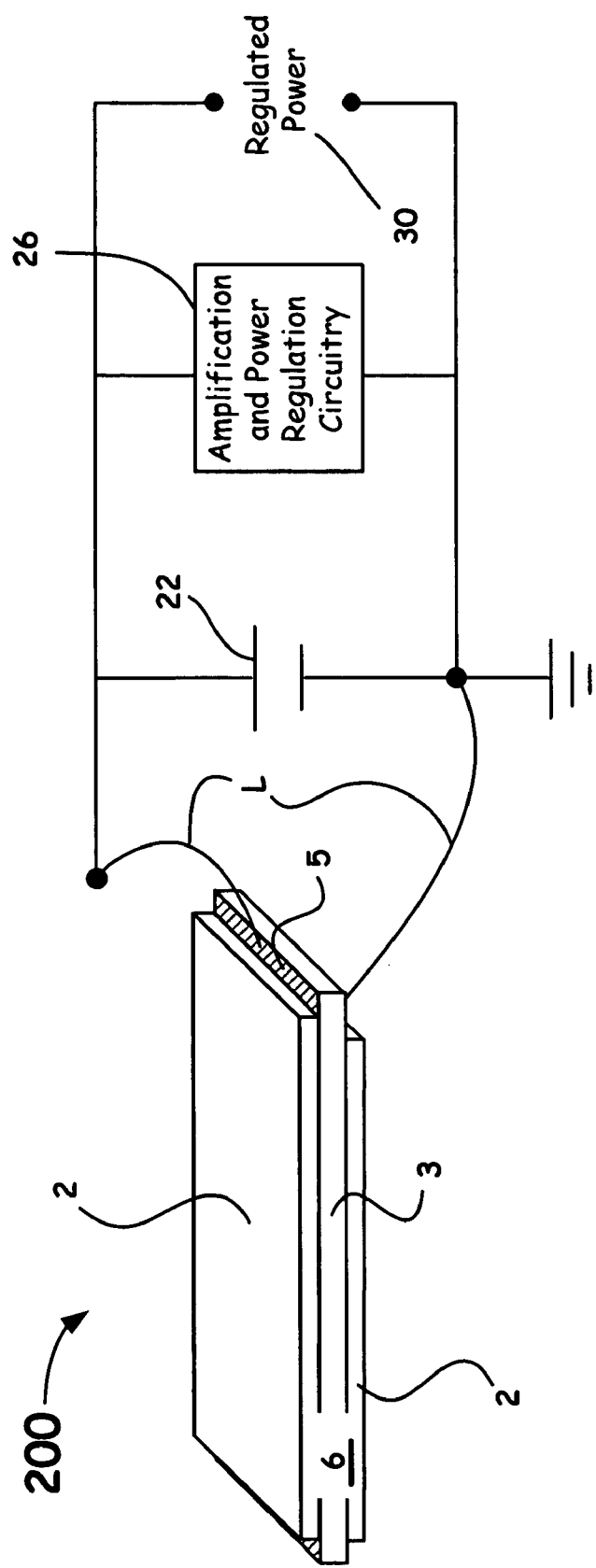
FIG. 2 illustrates another example embodiment of an energy harvesting apparatus.

Referring now to the following detailed information, and to incorporated materials; a detailed description of the invention, including specific embodiments, is presented.

Unless otherwise indicated, numbers expressing quantities of ingredients, constituents, reaction conditions and so forth used in the specification and claims are to be understood as being modified by the term "about." Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical value, however, inherently contains certain errors necessarily resulting from the standard deviation found in their respective testing measurements.

General Description

Thermostriction is the changing of a material's physical dimensions in response to changing its thermal state. In other words, a thermostriction material will change shape based on a phase transformation when it is subjected to a predetermined temperature. The present invention provides a system of harvesting energy using a thermoelectric material that includes a material (i.e., a thermostrictive material) exhibiting a large thermally induced strain (TIS), coupled to a material exhibiting a stress induced electric field.

A material that exhibits such a phase transformation exhibits a large increase in the coefficient of thermal expansion over an incremental temperature range (typically several degrees Kelvin). The linear strain exhibited during the phase transformation of a material (a material arranged as a laminate or in other configurations known to those skilled in the art) of the present invention ranges from about 0.1% to about a 2% strain. When a material, having various compositions thereof, such as, but not limited to, NiTi; NiTiCu; NiTiPd; AuCd; CuZnAl; ($Ni_2MnGa$; $Gd_5Ge_2Si_2$; $La(Fe_{0.88}Si_{0.12})_{13}$; $La_{0.7}Ba_{0.3}MnO_3$, and other compositions thereof; FeRh; $[(Fe_{1-x}Ni_x)_{49}Rh_{51}]$, with x in the range between about 0.000 and about 0.050; and $Sm_{0.55}Sr_{0.45}MnO_3$; $[MnFeP_{1-x}As_x]$, with x in the range between about 0.250 and about 0.065; is coupled with a material that exhibits a stress induced electric field (e.g. a piezoelectric material, such as a lead based zirconate titanate (PZT) crystal or PZT fiber), the thermally induced strain is converted to an electric field.

Specific Description

Turning now to the drawings, FIGS. 1(a) and 1(b) illustrates an example beneficial arrangement of an energy harvesting apparatus and is generally designated as reference numeral 100. Such an arrangement includes an anchored (denoted by the reference numeral 1) thermoelectric laminate 6 having a thermally induced strain (TIS) material 2 and a piezoelectric material 3, such as, piezoelectric polymers (e.g., PVDF), or piezoelectric single crystals (e.g., PMN-PT), or often, a lead based zirconate titanate (PZT) ceramic, such as, PZT-5A, PZT4, and PZT-8, more often, PZT-5H operating on a bimorph principle or in any other beneficial geometric arrangement that is known to those skilled in the art. While PZT materials are generally utilized in the present invention, it is understood that other piezoelectric materials generally equivalent to PZT ceramics, such as, for example, $BaTiO_3$ and quartz, can also be utilized in the present invention without departing from the spirit and scope of this application.

When thermally induced strain (TIS) material 2, e.g., $Gd_5Ge_2Si_2$, is at a high temperature phase, laminate 6 is at an unstressed state and is in contact with, for example, a heat sink (or $T_{cold}$) 14 that is often utilized by one of ordinary skill in the art, e.g., thermoelectrically, etc. When TIS material 2 is sufficiently cooled to undergo a phase transformation to a low temperature phase, it strains, causing laminate 6 to bend, as shown in FIG. 1(b). This breaks a contact 10, as shown in FIG. 1(a), with heat sink 14 and establishes a contact 16, as shown in FIG. 1(b), with heat source (or $T_{hot}$) 18.

Once the material is sufficiently heated, TIS material 2 returns to the high temperature phase and the laminate reestablishes contact 10, as shown in FIG. 1(a), with heat sink (i.e., $T_{cold}$) 14. A resultant voltage produced by piezoelectric material 3 can be coupled to circuitry by electrical leads (denoted by the letter L) and stored by, for example, an electrically coupled charging capacitor 22. Such a stored charge can be amplified and regulated by circuitry 26, and a regulated power 30 can be used to power devices such as, for example, batteries (e.g., laptop computer batteries) or other devices remote or otherwise that can utilize such power. Such an energy harvesting process (having cycling frequencies of often up to about 1 kHz and higher) can be repeated as long as the difference between $T_{hot}$ 18 and $T_{cold}$ 16 is larger then the temperature hysteresis associated with the phase transformation.

FIG. 2 illustrates another example beneficial arrangement, generally designated as reference numeral 200, wherein a laminate 6 having materials of the present invention can be configured as one or more layers. For example, laminate 6 can be arranged with a piezoelectric material 3, such as, but not limited to a lead based zirconate titanate (PZT) crystal, such as, PZT-5A, PZT4, and PZT-8, more often, PZT-5H, sandwiched between a TIS material 2 of the present invention having electrical leads (denoted by the letter L) coupled to a conductive material 5 deposited on piezoelectric material 3. As stated above, it is to be understood that other piezoelectric materials generally equivalent to PZT ceramics can also be utilized in the present invention without departing from the spirit and scope of this application.

When thermally induced strain (TIS) material 2, e.g., $Gd_5Ge_2Si_2$, is at a high temperature phase because of a thermal load, such as heat produced from, for example hot asphalt or heat generated from computers, laminate 6 is at an unstressed state and no induced electric field is produced by piezoelectric material 3. When TIS material 2 is sufficiently cooled by techniques known to those skilled in the art to undergo a phase transformation to a low temperature phase, it strains, (e.g., it undergoes a linear and volumetric change)

causing an induced electric field by piezoelectric material 3. Such an induced electric field can be coupled to circuitry by electrical leads (denoted by the letter L) as stated above in the description of FIG. 1, and stored as a voltage by, for example, an electrically coupled charging capacitor 22. Such a stored charge can subsequently be amplified and regulated by circuitry 26, and a regulated power 30 can be used to power devices as described above. Such an energy harvesting process can be repeated as long as a cycled temperature difference (having cycling frequencies of up to about 1 kHz) is larger then the temperature hysteresis associated with the phase transformation of TIS material 2.

As an illustration only of such a capability: by using about a 0.005" thick (t) by about a 0.25" by 0.25" plate of PZT5H having a piezoelectric coefficient of $d_{31}=-320$ E-12 m/V and a capacitance C=1250 nF; and using a thermally induced strain of about 0.85% for the thermostrictive material and a frequency of operation of 100 Hz (f); a voltage (V)=($\epsilon$t)/d31 =3400, resulted, (for 0.85% strain) where E is the strain, equating to about 710 Watts of power capable of being utilized for a variety of applications.

Example measurements using bulk $Gd_5Si_2Ge_2$ as the TIS material and bulk PZT-5H ceramic as the piezoelectric material, as shown in FIGS. 1(*a*)-1(*b*) produced in one example arrangement, a peak work output of about 11 mj during the phase transformation from the high temperature phase to the low temperature phase. Knowing the properties of PZT-5H, and using the measured work output and the corresponding cycled temperature range of 10K, a Seebeck coefficient of about 1800V/K resulted. Such a surprising Seebeck coefficient result is several orders of magnitude larger then the current state of the art.

For various geometric configurations, such as, but not limited to, laminate arrangements, film thicknesses can be chosen to optimize an output signal and/or such laminates are arranged in view of mechanical strength considerations. For example, such laminates can alternate in materials and/or thicknesses with various arrangements of PZT and/or thermostrictive sandwhich configurations. Moreover, various deposition techniques, such as, for example, laser ablation, ion beam deposition, chemical vapor deposition, etc., can be utilized as means for creating such thin film laminates. Acrylics, adhesives, synthetic rubber resins, epoxies and cyanoacrylates can be utilized in lamination and assembly. Some designs of the present invention may use external metallic or conductive substrates as the lead electrodes. The external metal surface can be in direct contact with the unmetallized film to collect the charge, or capacitive coupling through thin adhesive tapes or epoxy layers can be incorporated for ac applications.

TIS Properties

The majority of TIS materials of the present invention have been utilized for their magnetocaloric properties. The strain exhibited in such TIS materials is due to a phase transformation coupled with a large change in volume, which can be thermally, magnetically or mechanically induced. A beneficial material of the present invention is $Gd_5Ge_2Si_2$. Such a material exhibits about a 1% change in volume at a Curie temperature of about 255K. $Gd_5Ge_2Si_2$ is orthorhombic prior to the phase transformation with a cell volume of about 866.5 Angstroms$^3$ and unit cell constants values (i.e., crystallographic axis) of: a=7.5132 Angstroms, b=14.797 angstroms, c=7.7942 Angstroms. $Gd_5Ge_2Si_2$ undergoes a coupled magnetic and structural phase transformation (i.e., transforms to a monoclinic unit cell structure with a cell volume of about 874.7 Angstroms$^3$ and unit cell constants values of: a=7.5891 Angstroms, b=14.827 Angstroms, c=7.7862 Angstroms) near room temperature (about −10 degrees Celsius).

Figure 3:
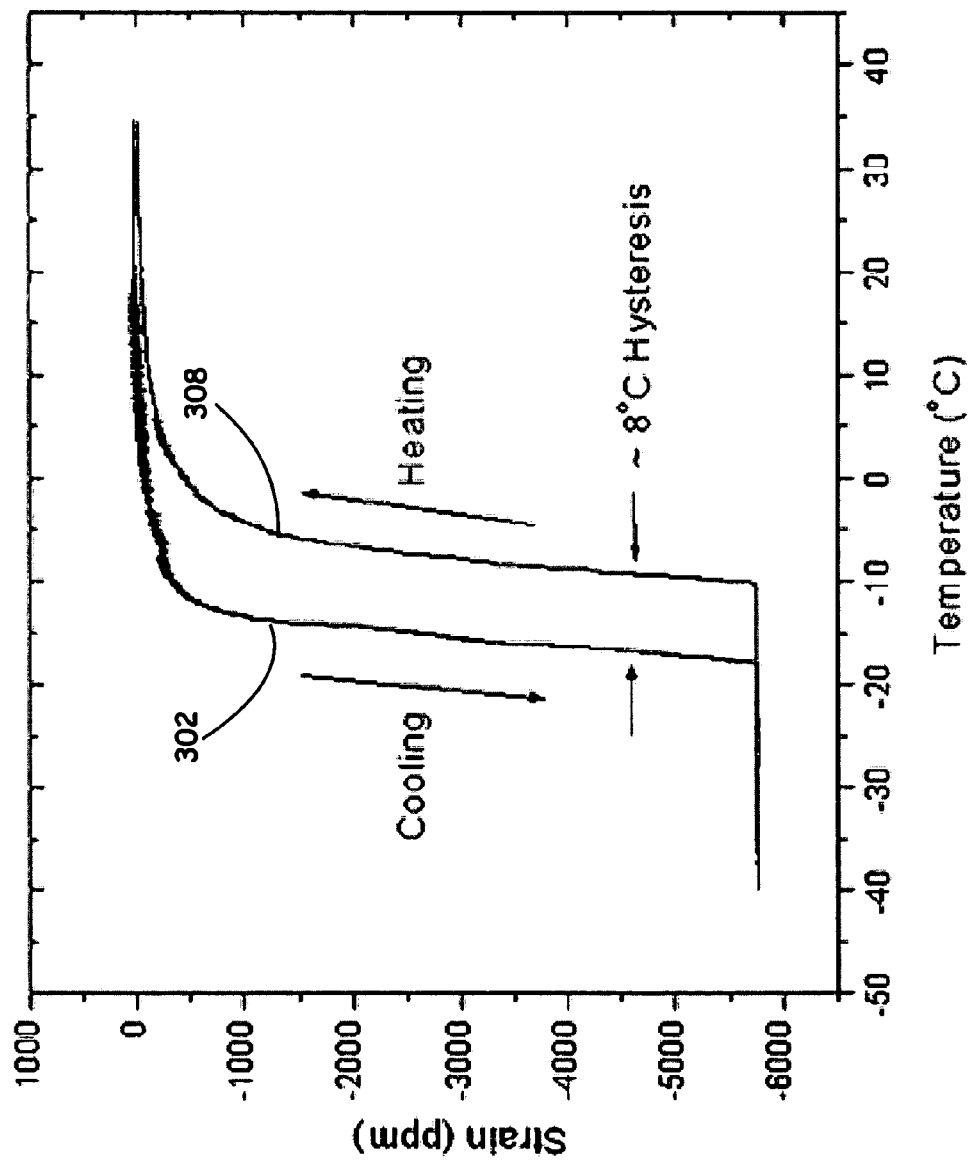
FIG. 3 illustrates a hysteresis strain plot of $Gd_5Ge_2Si_2$.

FIG. 3 shows a strain measurement plot for a polycrystalline crystal $Gd_5Ge_2Si_2$ and illustrates the phase transformations discussed herein before. Initially, such a material is in the orthorhombic state. Upon cooling by means known to those skilled in the art, such as, for example, thermoelectrically cooling, convection, etc., to a temperature less than about −18 degrees Celsius, a phase transformation along the hysteresis loop path 302 occurs wherein the $Gd_5Ge_2Si_2$ material transforms into the monoclinic cell structure. Upon heating, from, for example, hot asphalt, solar energy, or heat generated from computers, etc., such a material follows along the path denoted by the reference numeral 308 and transforms back into the orthorhombic cell structure to produce in this example measurement, a strain of about 0.8%. As discussed above, when configured, for example, as a laminate with a piezoelectric material as disclosed herein, a resultant strain of up to about 2% induced by predetermined temperature ranges can produce a Seebeck coefficient measurement as high as 1800 V/K with efficiencies as high as about 36%.

Figure 4:
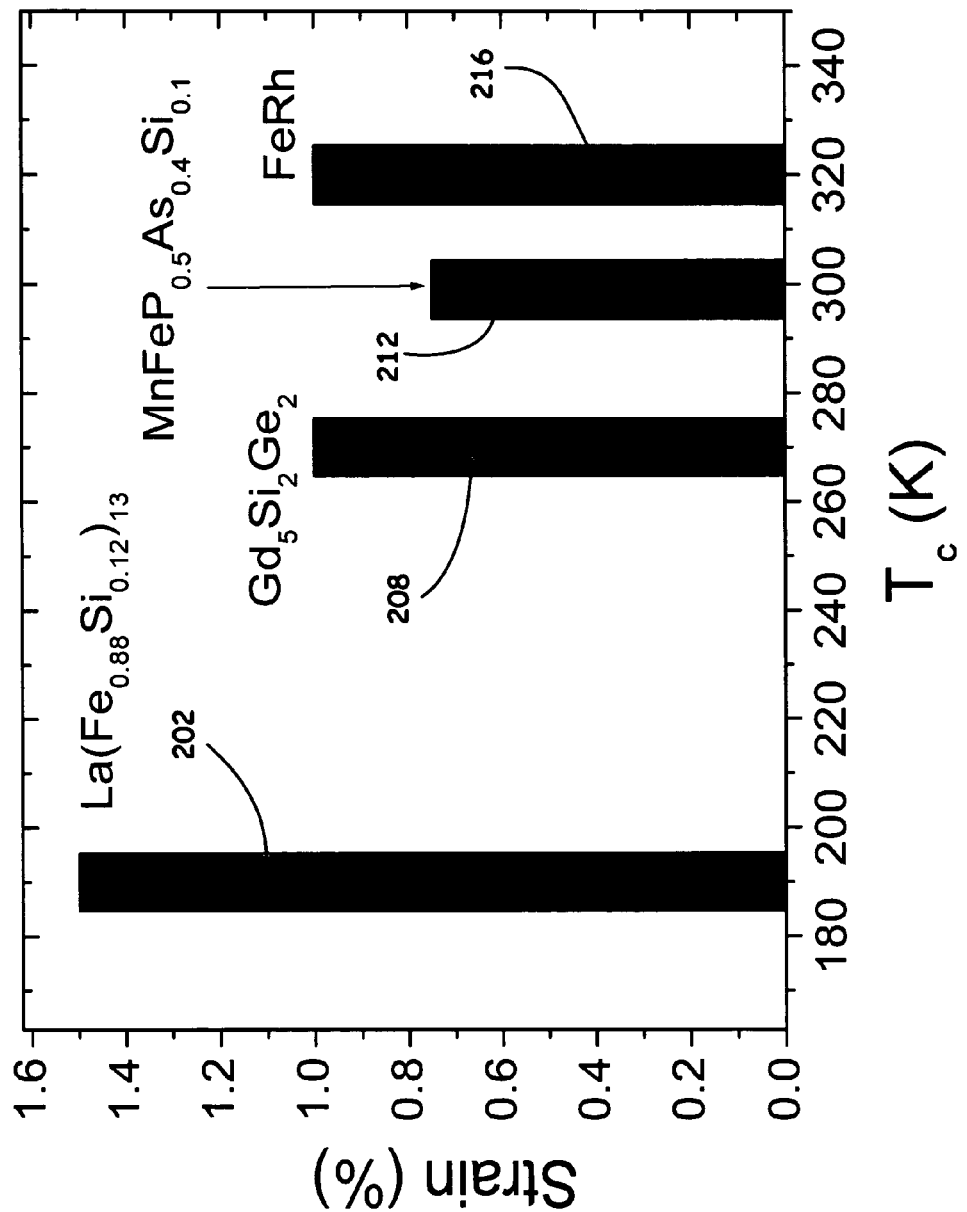
FIG. 4 shows a strain versus temperature plot of example magnetorestrictive materials utilized in the present invention.

FIG. 4 shows a measured strain as a function of the Curie temperature for additional example TIS materials capable of being utilized in the present invention. Each material, i.e., $La(Fe_{0.88}Si_{0.12})_{13}$ 202, $La_{0.7}Ba_{0.3}MnO_3$ 208, $MnFeP_{0.5}As_{0.4}Si_{0.1}$ 212, and FeRh 216, is capable of being incorporated as a thermoelectric laminate for use in the present invention. Such materials are desired based on the maximum strain, the Curie temperature, the temperature hysteresis, the mechanical properties, and the cost of manufacturing such materials into, for example a laminate. Moreover, although such materials in addition to $Gd_5Ge_2Si_2$ are capable of being utilized in the present invention, any other thermostrictive material that has desired properties, such as, but not limited to, $La(Fe_{0.88}Si_{0.12})_{13}$; $La_{0.7}Ba_{0.3}MnO_3$, and other compositions thereof; FeRh; $[(Fe_{1-x}Ni_x)_{49}Rh_{51}]$, with x in the range between about 0.000 and about 0.050; and $SM_{0.55}Sr_{0.45}MnO_3$; $[MnFeP_{1-x}As_x]$, with x in the range between about 0.250 and about 0.065; NiTi; NiTiCu; NiTiPd; AuCd; CuZnAl; and $Ni_2MnGa$, can also be incorporated into the present invention, as discussed above, without departing from the spirit and scope of the application.

Changes and modifications in the specifically described embodiments can be carried out without departing from the scope of the invention, which is intended to be limited by the scope of the appended claims.

The invention claimed is:

1. An energy harvesting system, comprising:
    a cooling source capable of producing a predetermined temperature gradient;
    a heating source capable of producing a predetermined temperature gradient;
    a thermoelectric material, further comprising:
        one or more thermostrictive materials capable of producing a predetermined induced strain when subjected to a cycled contact with said cooling source and said heating source over a predetermined temperature range;
        one or more piezoelectric materials capable of producing an induced voltage resulting from said predetermined induced strain produced by said one or more thermostrictive materials; and
    wherein a predetermined power output is capable of being produced by said system at a frequency determined by said cycled predetermined temperature range.

2. The system of claim 1, wherein said one or more thermostrictive materials comprises at least one of: $Gd_5Ge_2Si_2$;

La(Fe$_{0.88}$Si$_{0.12}$)$_{13}$; La$_{0.7}$Ba$_{0.3}$MnO$_3$; FeRh; [(Fe$_{1-x}$,Ni$_x$)$_{49}$Rh$_{51}$], with x in the range between about 0.000 and about 0.050; and Sm$_{0.55}$Sr$_{0.45}$MnO$_3$; [MnFeP$_{1-x}$As$_x$], with x in the range between about 0.250 and about 0.065; NiTi; NiTiCu; NiTiPd; AuCd; CuZnAl; and Ni$_2$MnGaLa.

3. The system of claim 1, wherein said one or more piezoelectric materials comprises at least one lead zirconate titanate (PZT) material selected from: PZT-5H, PZT-5A, PZT-4, and PZT-8.

4. The system of claim 3, wherein said one or more piezoelectric materials comprises at least one material selected from: a piezoelectric polymer and a piezoelectric single crystal.

5. The system of claim 4, wherein said piezoelectric material comprises a Seeback coefficient of up to about 1800 volts/°K.

6. The system of claim 1, wherein said predetermined temperature range comprises at least 20° C.

7. The system of claim 1, wherein said strain can be up to about 10%.

8. The system of claim 6, wherein said predetermined temperature range comprises computer generated heat.

9. The system of claim 6, wherein said predetermined temperature range comprises heat produced from hot asphalt.

10. The system of claim 6, wherein said predetermined temperature range comprises solar energy.

11. The system of claim 1, wherein said thermoelectric material comprises a laminate of said one or more thermostrictive materials and said one or more piezoelectric materials.

12. The system of claim 1, wherein said one or more thermostrictive materials comprises at least one of: single crystals, polycrystalline, and composites.

13. The system of claim 1, wherein said cycled contact comprises a frequency of up to about 1 kHz.

14. The system of claim 1, wherein said cycled contact comprises a frequency of greater than about 1 kHz.

15. An energy harvesting method, comprising:
   providing a cooling source capable of producing a predetermined temperature gradient;
   providing a heating source capable of producing a predetermined temperature gradient;
   providing a thermoelectric material, wherein said thermoelectric material further comprises:
   one or more thermostrictive materials capable of producing a predetermined induced strain when subjected to a cycled contact with said cooling source and said heating source over a predetermined temperature range;
   one or more piezoelectric materials capable of producing an induced voltage resulting from said predetermined induced strain produced by said one or more thermostrictive materials; and
   wherein a predetermined power output is capable of being produced at a frequency determined by said cycled predetermined temperature range.

16. The method of claim 15, wherein said one or more thermostrictive materials comprises at least one of: Gd$_5$Ge$_2$Si$_2$; La(Fe$_{0.88}$Si$_{0.12}$)$_{13}$; La$_{0.7}$Ba$_{0.3}$MnO$_3$; FeRh; [(Fe$_{1-x}$Ni$_x$)$_{49}$Rh$_{51}$], with x in the range between about 0.000 and about 0.050; and Sm$_{0.55}$Sr$_{0.45}$MnO$_3$; [MnFeP$_{1-x}$As$_x$], with x in the range between about 0.250 and about 0.065; NiTi; NiTiCu; NiTiPd; AuCd; CuZnAl; and Ni$_2$MnGaLa.

17. The method of claim 15, wherein said one or more piezoelectric materials comprises at least one lead zirconate titanate (PZT) material selected from: PZT-5H, PZT-5A, PZT-4, and PZT-8.

18. The method of claim 17, wherein said one or more piezoelectric materials comprises at least one material selected from: a piezoelectric polymer and a piezoelectric single crystal.

19. The method of claim 18, wherein said piezoelectric material comprises a Seeback coefficient of up to about 1800 volts/°K.

20. The method of claim 15, wherein said predetermined temperature range comprises at least 20° C.

21. The method of claim 15, wherein said strain can be up to about 10%.

22. The method of claim 20, wherein said predetermined temperature range comprises computer generated heat.

23. The method of claim 20, wherein said predetermined temperature range comprises heat produced from hot asphalt.

24. The method of claim 20, wherein said predetermined temperature range comprises solar energy.

25. The method of claim 15, wherein said thermoelectric material comprises a laminate of said one or more thermostrictive materials and said one or more piezoelectric materials.

26. The method of claim 15, wherein said one or more thermostrictive materials comprises single crystals.

27. The method of claim 15, wherein said cycled contact comprises a frequency of up to about 1 kHz.

28. The method of claim 15, wherein said cycled contact comprises a frequency of greater than about 1 kHz.

* * * * *

UNITED STATES PATENT AND TRADEMARK OFFICE
CERTIFICATE OF CORRECTION

PATENT NO.         : 7,397,169 B2
APPLICATION NO.    : 11/082632
DATED              : July 8, 2008
INVENTOR(S)        : Nersessian et al.

It is certified that error appears in the above-identified patent and that said Letters Patent is hereby corrected as shown below:

Title page, item (73) Assignee: change "Lawrence Livermore National Security, LLC, Livermore, CA (US)" to --Lawrence Livermore National Security, LLC, Livermore CA (US) and The Regents of the University of California, Oakland, CA (US)--.

Signed and Sealed this
Second Day of July, 2013

Teresa Stanek Rea
*Acting Director of the United States Patent and Trademark Office*